United States Patent [19]

Danis et al.

[11] Patent Number: 4,928,411

[45] Date of Patent: May 29, 1990

[54] TRAY INCLUDING DISPLAY

[75] Inventors: Sara L. Danis, McLean; Charles L. Skaggs, Great Falls; Charles A. Thomas, Fairfax, all of Va.

[73] Assignee: Mobil Oil Corporation, New York, N.Y.

[21] Appl. No.: 218,794

[22] Filed: Jul. 14, 1988

[51] Int. Cl.[5] .................................... G03F 3/00

[52] U.S. Cl. .................................... 40/324

[58] Field of Search ................. 40/324, 152, 661, 359, 40/64, 643, 647; 206/557, 560, 562-564, 815, 555; 220/326, 306

[56] References Cited

U.S. PATENT DOCUMENTS

| | | | |
|---|---|---|---|
| 1,600,658 | 9/1926 | Weil | 40/324 |
| 3,430,803 | 3/1969 | Nelson | 206/557 |
| 3,698,594 | 10/1972 | Boehlert | 206/815 |
| 4,746,008 | 5/1988 | Heverly et al. | 220/306 |

FOREIGN PATENT DOCUMENTS

| | | | |
|---|---|---|---|
| 2914846 | 10/1980 | Fed. Rep. of Germany | 40/152 |

*Primary Examiner*—Richard J. Apley
*Assistant Examiner*—D. F. Crosby
*Attorney, Agent, or Firm*—Alexander J. McKillop; Charles J. Speciale; Jessica M. Sinnott

[57] ABSTRACT

A tray assembly is provided which allows an information-carrying substrate to be seen through a cover portion thereof. The assembly includes a transparent cover mounted to an opaque base. The substrate is inserted between the cover and base which are then secured to each other. Openings are provided within the base to allow the cover to be detached therefrom. The cover and base include corresponding peripheral channel and ridge portions, respectively, which facilitate the mounting of the cover to the base. The ridge portions of the base also center the substrate. Projections extending from the longitudinal edges of the cover extend through corresponding slots in the base to provide locking engagement of the two members.

20 Claims, 3 Drawing Sheets

TRAY INCLUDING DISPLAY

BACKGROUND OF THE INVENTION

1. Field of the Invention

The field of the invention relates to assemblies for displaying photographs, advertising or other printed or pictorial material.

2. Brief Description of the Prior Art

It is often desirable to provide decorative or informative material upon articles provided to customers in commercial situations. If the articles are reusable, it is particularly desirable if such material can be changed whenever appropriate.

A tray used temporarily by a customer provides an ideal medium for conveying information thereto. Since trays, if made from hard plastic or other such materials, are relatively durable and can be used many times before replacement becomes necessary, it is advantageous if information carried by the tray can be changed easily. U.S. Pat. No. 4,679,691 provides one example of such a tray. The patented structure concerns a tip tray having retention members which allow a display card to slide under the transparent upper surface of the tray.

Clear plastic picture frames have been designed primarily to display photographs and the like and to provide means for mounting the frames to a wall or in a relatively upright position upon a horizontal surface. One such frame includes a clear plastic surface and four integral walls extending rearwardly therefrom. A cardboard insert may be inserted within the cavity defined by the four plastic walls and is retained thereby. A photograph may be positioned between the clean plastic surface and the front wall of the cardboard insert. The insert includes a rear wall parallel to the front wall thereof. The rear wall includes one or more openings to allow a user to insert his fingers therein. The insert may accordingly be removed to enable the user to replace the picture.

SUMMARY OF THE INVENTION

The invention is directed to a tray or the like including a base and a cover securable to the base. A planar, message-carrying substrate may be positioned between the base and cover. The cover is preferably transparent or translucent such that the substrate can be viewed therethrough.

Means are provided for locking the cover to the base. Means are also provided for allowing the cover to be easily unlocked by a user. The base portion preferably includes at least one opening for providing access to the substrate and cover.

A peripheral ridge extends upwardly from the upper surface of the base. The ridge preferably includes a pair of sloping sides. A corresponding peripheral ridge is defined in the cover. The cover ridge serves two purposes, one being to define a raised border on the upper surface of the cover, thereby allowing it to be used as a tray. The cover ridge also defines a peripheral channel in the bottom surface of the cover within which the base ridge may be positioned. The message-carrying substrate preferably has dimensions corresponding to those of the inner surface of the base ridge.

The invention provides a convenient means for presenting such materials as charge slips and writing instruments to a consumer who may not otherwise have an acceptable writing surface available. When not being used as a writing surface, the tray may be stored in a visible location so that the information displayed thereby can be read. The message-carrying substrate may easily be reversed or removed. If such removal requires disassembly or the tray, the components thereof are easily reassembled.

Figure 3:
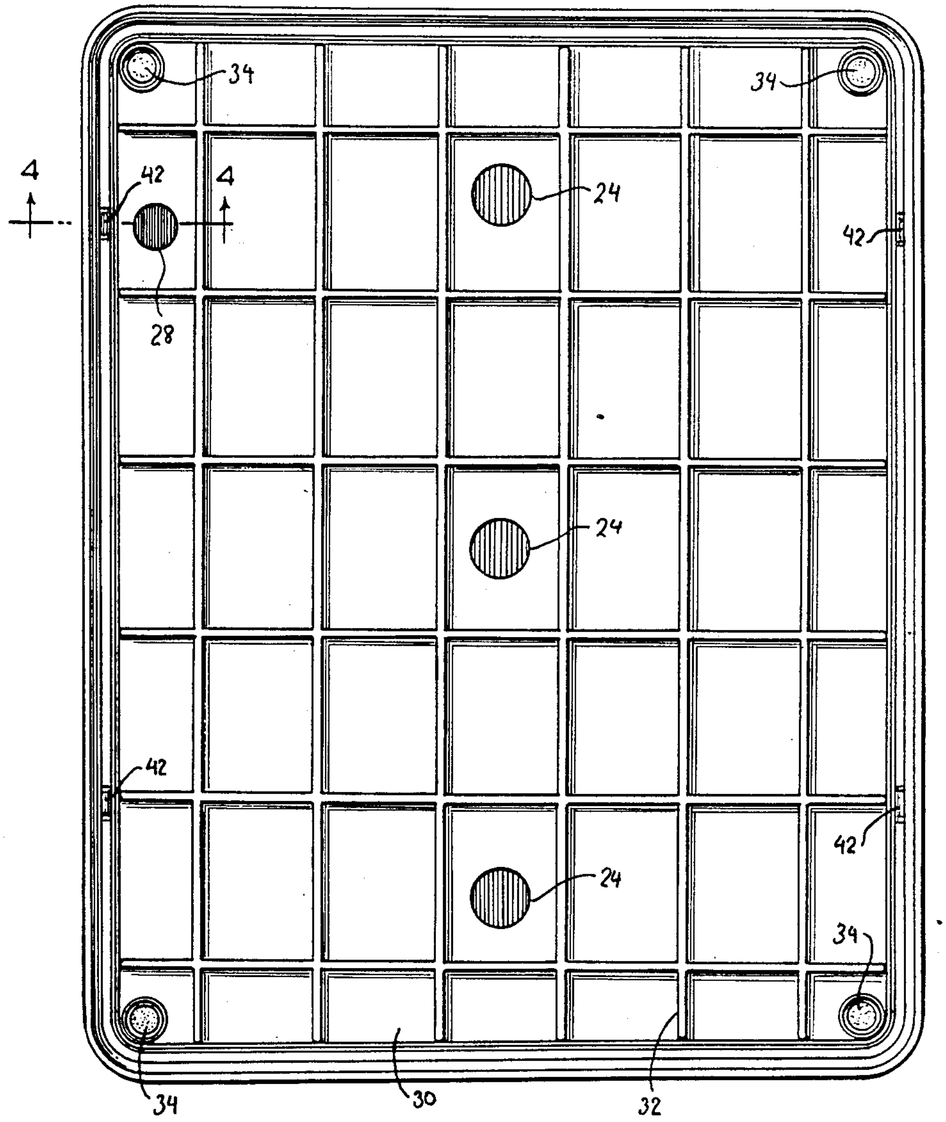
Figure 4:
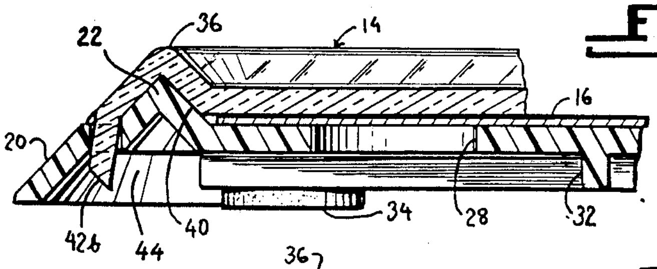

FIG. *2a* is a partial, enlarged side elevation view thereof;

FIG. 3 is a bottom plan view thereof;

FIG. 4 is a sectional view taken along line 4—4 in FIG. 3; and

Figure 5:
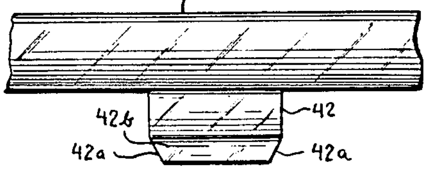

FIG. 5 is an enlarged front elevation view of a portion of the tray cover.

DETAILED DESCRIPTION OF THE INVENTION

Figure 1:
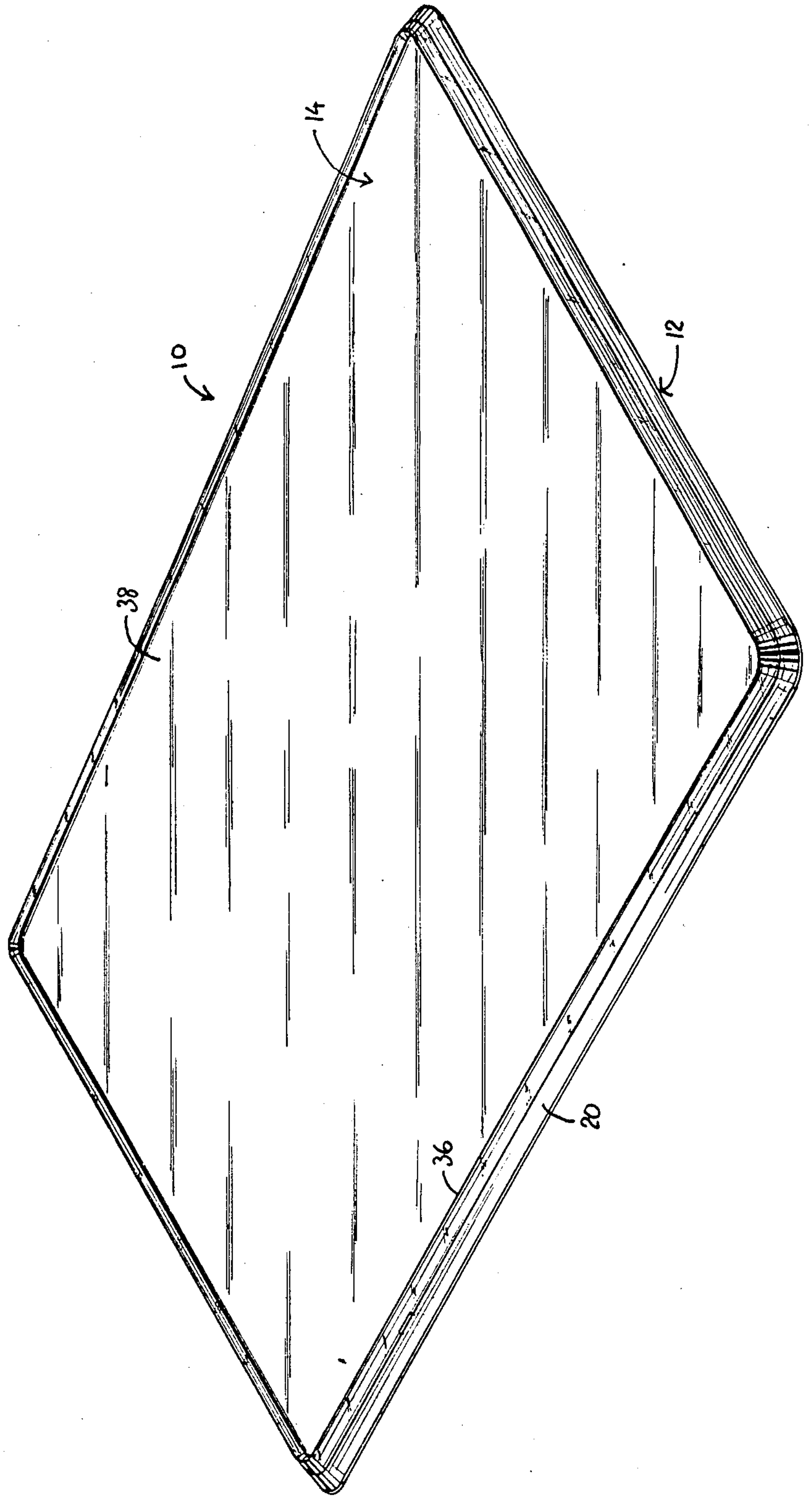
FIG. 1 is a perspective view of a tray assembly according to the invention.
Figures 2, 2A:
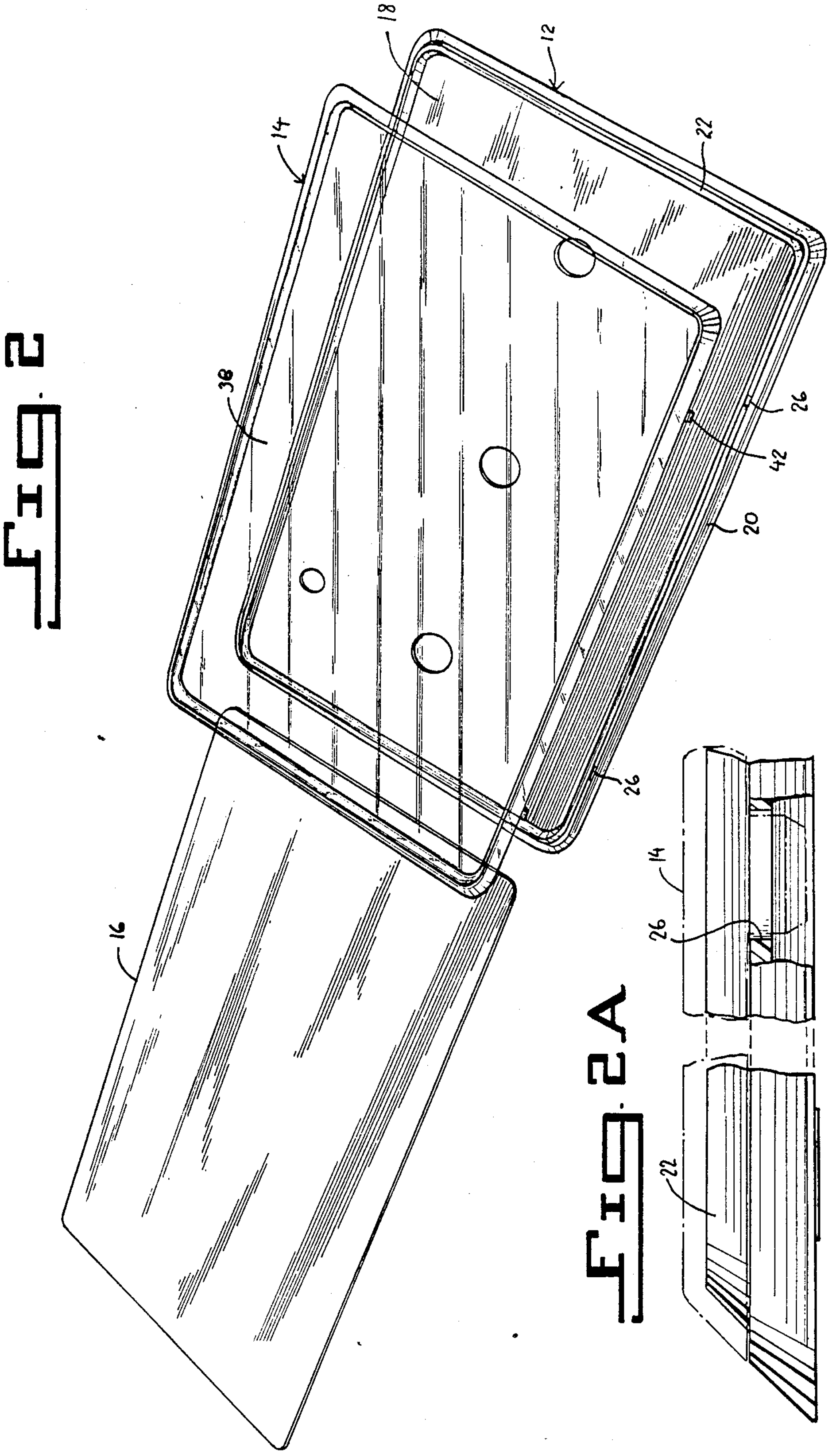
FIG. 2 is an exploded perspective view thereof.

Referring by way of example to FIGS. 1 and 2, a tray assembly 10 according to the invention is shown including a substantially flat base 12, a cover 14, and a planar substrate 16, positioned between the base and cover. The base is integrally molded and is preferably opaque. The cover is also integrally molded, but is preferably transparent. Both the base and cover may be made from any suitable, relatively light weight material such as plastic. The cover should be scratch and stain resistant.

As shown in FIGS. 2–4, the base 12 includes a substantially flat rectangular upper surface 18, a peripheral rim 20 extending downwardly from the upper surface, and a ridge 22 protruding upwardly from the upper surface. The rim 20 defines about a forty-five degree angle with respect to the upper surface 18.

The ridge 22 is preferably substantially V-shaped in cross section. The two sides of the ridge extending above the upper surface 18 of the base 12 each define about a one hundred thirty-five degree angle with the upper surface. The exterior surface of the ridge is accordingly substantially parallel to the exterior surface of the rim 20.

Three relatively large, circular openings 24 are provided along the center line of the base. Two pairs of rectangular slots 26 extend through the base. The width of the rectangular slots is defined by the distance between the outer edge portion of the ridge 22 and the edge of the upper surface 18. The pairs of rectangular slots are each positioned along the longitudinal edges of the upper surface of the base and are in opposing relation to each other. A relatively small circular opening 28 extends through the base on the opposite side of the ridge 22 from one of the rectangular openings 26. This relatively small opening is large enough to allow a portion of an average size finger to fit therethrough. It will be appreciated that differently shaped slots and openings may be successfully employed.

The bottom surface 30 of the base includes a grid of integral reinforcing members 32 extending therefrom. A resilient polymeric foot 34 is secured near each of the four corners of the bottom surface. The feet 34 extend slightly below the lower surface of the rim 20 to prevent the tray assembly 10 from sliding when placed on a smooth surface.

Referring now to FIGS. 1, 2, 4 and 5, the cover 14 has substantially the same general configuration as the base, but is slightly smaller in size. It also does not include a separately defined peripheral rim. A peripheral ridge 36 instead defines the boundaries of the cover. The ridge is substantially V-shaped in cross section, but has a rounded top surface. It defines a raised border on the upper surface 38 of the cover for preventing objects placed on the cover from sliding off. The ridge also defines a triangular channel 40 within the bottom surface of the cover. The base ridge 22 fits within this channel as shown in FIG. 4.

Two pairs of projections 42 extend from each longitudinal edge of the cover 14. Each projection includes a pair of inwardly extending surfaces 42*a* as viewed in the front elevation view shown in FIG. 5, and a bevelled front surface 42*b* as shown in FIGS. 4 and 5. The construction of the projections 42 facilitates their insertion into the rectangular openings 26 defined in the base.

The planar substrate 16 may be constructed from either rigid or flexible material. If a thin, flexible material is employed, it may be inserted between the cover and base without the need to disassemble them. The substrate is simply inserted between the base and cover at either end which does not include the locking projections 42. Access to the substrate may be gained through the large, circular openings to slide it into position. Removal of the substrate may be accomplished by reversing the above steps.

FIGS. 1 and 4 most clearly illustrate the tray assembly with the cover locked to the base and the planar substrate positioned therebetween. The dimensions of the substrate, being substantially the same as the inner edges of the ridge 22 of the base 12, allow the substrate to be maintained in the proper position regardless of the orientation of the tray assembly 10.

The sizes and positions of the base openings 24, 26, 28 are important in assembly, disassembly and use of the product. The small circular opening 28 is strategically placed adjacent to one of the rectangular slots 26. The projection 42 therein may accordingly be pushed out of the slot 26 without causing excessive stress to be exerted upon the cover 14. Once one projection has been freed, a second projection on the same side thereof may be disengaged from the base by sliding ones's finger between the cover and the base in the direction of the second projection. Each of the rectangular slots (26) is provided with an internal clearance (44) between the slots and the base. This permits limited axial rotation of the projections in the slots along a common edge. Thus obviating the requirement for complete separation of the cover from the base when removing or inserting the substrate (16). To prevent the cover from being inadvertently detached from the base, the circular opening 28 is small enough to only allow a portion of an average size finger to be inserted therethrough. When the tray assembly is handled by an individual, the orientation of the fingers with respect thereto would not ordinarily be such that any finger would exert sufficient pressure on the cover to detach it from the base, even if positioned directly over the opening 28. The use of only a single such opening 28 near the edge of the base also helps prevent accidental disassembly. The three larger openings 24, which may also be employed in unlocking the cover from the base, are located far enough from the edges of the tray assembly that the user's fingers would not be expected to be unintentionally inserted therein.

The projections 42 are positioned and configured such that they deflect inwardly upon mounting the cover to the base and "snap" outwardly into a locked position once the bevelled front surfaces 42*b* thereof pass through the respective rectangular slots 26. When in the locked position, the outer inclined surface of the ridge 36 of the cover 14 is coplanar with the outer surface of the rim 20 of the base 12, the base ridge is positioned within the cover channel 40, and the lower edge of the cover adjoins the upper surface 18 of the base.

The tray assembly 10 may be used in a variety of applications where it is desirable to inform the user of information provided on the substrate 16. One such application is a change tray for service station use where the information may concern which credit cards are acceptable at the particular station, or any special offers of goods or services at the station. Since such information is apt to change from time to time, the ability to change displays is very useful.

Other applications of the invention would be readily appreciated by those skilled in the art.

What is claimed is:

1. A tray assembly comprising:

a substantially flat, rectangular, base having opposing longitudinal and transverse edges including an upper surface and a peripheral ridge extending upwardly from said upper surface;

a rectangular cover having opposing longitudinal and transverse edges mounted to said base, said cover including a channel defined in a lower surface thereof, said ridge being positioned within said channel;

an opening extending through said base, said opening providing access to said cover; and means for locking said base to said cover, wherein said locking means includes a plurality of projections integral with and extending downwardly from opposing longitudinal edges of said cover, a plurality of slots defined within said base along the longitudinal edges of the base, said projections being positioned respectively within said slots, each of said slots, having a clearance below the peripheral ridge and extending inward, toward the opposing edge, said clearance permitting limited axial rotation of said projection when engaged in their respective slots along a common edge and enabling said cover to pivot away from the base for insertion or removal of a substrate.

2. An assembly as defined in claim 1 wherein said locking means includes a plurality of projections integral with and extending downwardly from said cover, a plurality of slots defined within said base, said projections being positioned respectively within said slots.

3. An assembly as defined in claim 2 wherein said base and cover each have a substantially rectangular configuration, said projections extending from the longitudinal edges of said cover.

4. An assembly as in claim 3 wherein said projections extend only from the longitudinal edges of said cover.

5. An assembly as defined in claim 4 wherein said ridge and said channel are each substantially V-shaped in cross section.

6. An assembly as defined in claim 5 wherein said cover includes an integral, peripheral ridge extending from the upper surface thereof, said ridge of said cover being substantially V-shaped in cross section, the bottom surfaces of said ridge of said cover defining said channel.

7. An assembly as defined in claim 6 wherein said base includes a plurality of resilient feet extending from the bottom surface thereof.

8. An assembly as defined in claim 1 including a planar substrate positioned between said base and said cover, said planar substrate having substantially the same dimensions as said peripheral ridge.

9. An assembly as defined in claim 1 wherein said cover is transparent.

10. An assembly as defined in claim 8 wherein said substrate is flexible.

11. An assembly as defined in claim 2 wherein each of said projections includes a bevelled front surface.

12. A tray assembly comprising:

a substantially flat, rectangular base including a flat planar upper surface, a lower surface, a rim extending downwardly from said upper surface, and a peripheral ridge extending upwardly from said upper surface;

a substantially flat, rectangular cover including an upper surface, a lower surface, and an integral, peripheral ridge extending upwardly from said upper surface, said integral peripheral ridge defining a peripheral channel within said lower surface of said cover, said cover being mounted to said base such that said ridge extending from said upper surface of said base is positioned within said channel;

means for locking said base to said cover; and a peripheral edge formed on said flat, planar upper surface of said base, said rim extending downwardly from said edge, said peripheral ridge having an outer edge and an inner edge, said outer edge being positioned a distance from said peripheral edge of said base, said cover including a peripheral lower edge adjoining the portion of said upper surface of said base extending between said outer edge of said peripheral ridge of said base and said peripheral edge of said planar surface.

13. A tray assembly as defined in claim 12, wherein each of said peripheral ridges of said base and cover, respectively, is substantially V-shaped in cross section.

14. A tray assembly as defined in claim 12 including a substantially rectangular, planar substrate positioned between said base and said cover, said substrate having approximately the same length and width as said peripheral ridge extending from said upper surface of said base.

15. A tray assembly as defined in claim 12 in which the means for locking the base to the cover include a plurality of slots extending through said portion of said base which adjoins the lower edge of said cover, said cover including a plurality of projections extending through said slots.

16. A tray assembly as defined in claim 15 including an opening extending through said base, said opening being positioned adjacent to one of said slots, said opening providing access to said cover.

17. A tray assembly as defined in claim 12 including an opening extending through said base.

18. A tray assembly comprising:

a substantially flat base including an upper surface and a peripheral ridge extending upwardly from said upper surface;

a cover mounted to said base, said cover including a channel defined in a lower surface thereof, said ridge being positioned within said channel;

an opening extending through said base, said opening providing access to said cover; and means for locking said base to said cover, wherein said locking means includes a plurality of projections integral with and extending downwardly from said cover, a plurality of slots defined within said base, said projections being positioned respectively within said slots, said base and said cover each have a substantially rectangular configuration, said projections extending from the longitudinal edges of said cover, said opening is positioned adjacent to one of said slots within said base.

19. A tray assembly as defined in claim 18 including a second opening extending through said base, said second opening being larger than said opening adjacent to one of said slots and being located a substantial distance from said edges of said base.

20. A tray assembly comprising:

a substantially flat base including an upper surface and a peripheral ridge extending upwardly from said upper surface;

a cover mounted to said base, said cover including a channel defined in a lower surface thereof, said ridge being positioned within said channel, said ridge and said channel are each substantially V-shaped in cross section;

an opening extending through said base, said opening providing access to said cover;

means for locking said base to said cover, wherein said locking means includes a plurality of projections integral with and extending downwardly from said cover, a plurality of slots defined within said base, said projections being positioned respectively within said slots, said base and said cover each have a substantially rectangular configuration, said projections extending from the longitudinal edges of said cover.

an integral, peripheral ridge extending from the upper surface of said cover, said ridge of said cover being substantially V-shaped in cross section, the bottom surfaces of said ridge of said cover defining said channel; and a peripheral rim extending downwardly from said upper surface of said base, the upper surface of said peripheral rim and an outer surface of said ridge of said cover being coplanar.

* * * * *